United States Patent
North et al.

(10) Patent No.: US 11,758,685 B2
(45) Date of Patent: Sep. 12, 2023

(54) THERMAL MODULE WITH A HYPERBARIC FAN SYSTEM FOR COOLING MULTIPLE FIN STACKS AND COMPONENTS IN A SEALED CHASSIS

(71) Applicant: Dell Products L.P., Round Rock, TX (US)

(72) Inventors: Travis C. North, Cedar Park, TX (US); Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 179 days.

(21) Appl. No.: 17/328,526

(22) Filed: May 24, 2021

(65) Prior Publication Data

US 2022/0377933 A1 Nov. 24, 2022

(51) Int. Cl.
*H05K 7/20* (2006.01)

(52) U.S. Cl.
CPC ..... *H05K 7/20145* (2013.01); *H05K 7/20209* (2013.01); *H05K 7/20554* (2013.01)

(58) Field of Classification Search
CPC ...... G06F 1/203; G06F 1/20; G06F 2200/201; H05K 7/20172; H05K 7/20336; H05K 7/20154; H05K 7/20554; H05K 7/20145; H05K 7/20209
USPC ......... 361/697, 679.48, 679.47, 695, 679.55, 361/679.54, 679.46, 709, 703, 679.5, 692, 361/719, 720; 165/80.3, 104.33
See application file for complete search history.

(56) References Cited

U.S. PATENT DOCUMENTS

| | | | |
|---|---|---|---|
| 2003/0161102 A1* | 8/2003 | Lee ......................... | G06F 1/203 361/679.48 |
| 2004/0201958 A1* | 10/2004 | Lev ....................... | H01L 23/467 361/679.48 |
| 2005/0103477 A1* | 5/2005 | Kim ........................ | G06F 1/203 165/104.33 |
| 2006/0078423 A1* | 4/2006 | Zheng .................... | F04D 17/04 415/206 |
| 2006/0078428 A1* | 4/2006 | Zheng ................... | F04D 29/424 415/206 |
| 2007/0086157 A1* | 4/2007 | Ruch ....................... | G06F 1/203 361/679.55 |
| 2008/0019827 A1* | 1/2008 | Hirata .................... | G06F 1/203 415/206 |
| 2012/0261101 A1* | 10/2012 | Takahashi ............... | G06F 1/203 415/206 |

(Continued)

*Primary Examiner* — Mandeep S Buttar
(74) *Attorney, Agent, or Firm* — McDermott Will & Emery LLP

(57) ABSTRACT

A thermal module for cooling a plurality of component and cooling a bottom cover of a sealed chassis. A pair of fans are positioned in the chassis, wherein each fan has a first fan outlet directing a first portion of the airflow toward a first fin stack near a vent in the back cover, a second fan outlet for directing a second portion of the airflow to a second fin stack near a vent in a side cover, and a third fan outlet for directing a third portion of the airflow to a set of components in the chassis or a surface of the chassis. The size of each fan outlet and the size and impedance of the first fin stack and the second fin stack are configured to ensure the airflow is distributed according to a ratio based on cooling a set of components in the chassis and a bottom cover of the chassis.

19 Claims, 3 Drawing Sheets

(56) References Cited

U.S. PATENT DOCUMENTS

2014/0063732 A1\* 3/2014 Lee .................. G06F 1/203
  361/679.54
2016/0077558 A1\* 3/2016 Delano .................. F28F 13/06
  165/122

\* cited by examiner

THERMAL MODULE WITH A HYPERBARIC FAN SYSTEM FOR COOLING MULTIPLE FIN STACKS AND COMPONENTS IN A SEALED CHASSIS

BACKGROUND

Field of the Disclosure

This disclosure relates generally to a portable information handling system and, more particularly, to a system for cooling multiple fin stacks and configured for increased cooling of a set of components in a sealed chassis.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be directed to a thermal module for cooling components in a sealed chassis. At least one fan may be positioned in a sealed portion of the chassis. A fan may have a fan-body ratio greater than 80%, wherein the dimensions of the fan are greater than 80% of the area dimensions of the fan housing (the "body"). A fan housing for a fan has three fan outlets, wherein the ratio of airflow exiting the three fan outlets is based on cooling the components in the sealed portion of the chassis by increasing cooling of multiple fin stacks and hyperbaric pressure causing airflow through the chassis. In some embodiments, a thermal module may include two fans, with each fan having three fan outlets and the two fans rotating in opposite directions to generate airflow through the chassis.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes and contained in a chassis. For example, an information handling system may be a laptop computer, a consumer electronic device, a network storage device, or another suitable device contained in a chassis and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

As information handling systems become smaller, the laptop thickness (the distance between the bottom cover and the keyboard) may be reduced, but newer components may generate more heat. Embodiments disclosed herein may include a thermal module configured to cool multiple fin stacks to cool information handling systems with central processing units (CPUs) or graphics processing units (GPUs) that generate considerable heat and are cooled using heat pipes and fin stacks. Embodiments disclosed herein also cool components inside a sealed chassis such that heat generated by a set of components inside the chassis does not increase the temperature of the bottom cover of the chassis.

Figure 1:
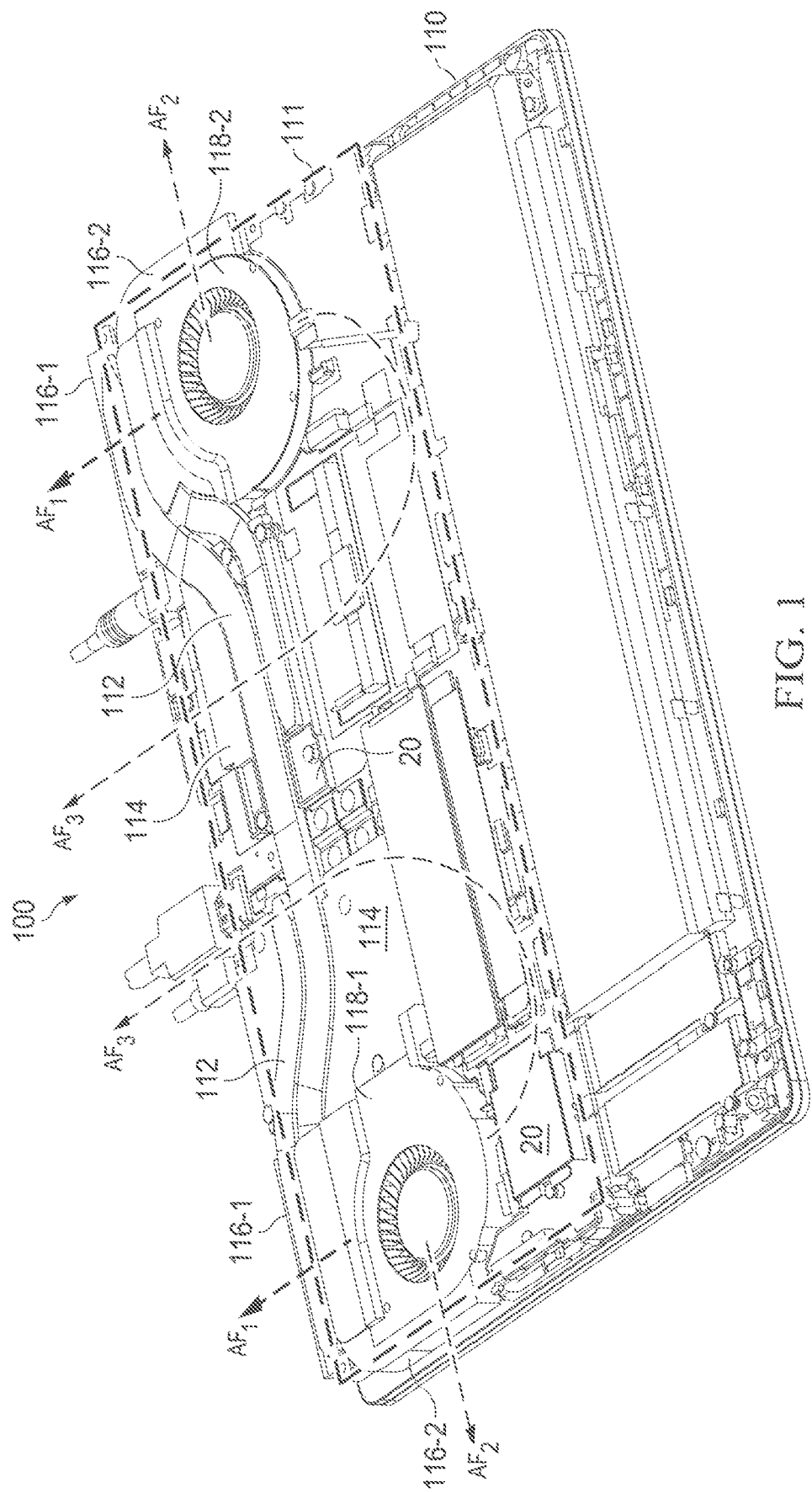
FIG. 1 depicts a perspective view of an information handling system in a sealed chassis and one embodiment of a thermal module for cooling multiple fin stacks and a set of components more internal in the chassis.

As shown in FIG. 1, components 20 of information handling system 100 may include, but are not limited to, components of a processor subsystem, a memory subsystem, a local storage resource subsystem, an I/O subsystem and a network subsystem.

Components 20 of a processor subsystem may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, components of a processor subsystem may interpret and execute program instructions and process data stored locally. In the same or alternative embodiments, components of a processor subsystem may interpret and execute program instructions and process data stored remotely (e.g., in a network storage resource).

Components 20 of a memory subsystem may comprise a system, device, or apparatus operable to retain and retrieve program instructions and data for a period of time (e.g., computer-readable media). Components 20 of a memory subsystem may comprise random access memory (RAM), electrically erasable programmable read-only memory (EEPROM), a PCMCIA card, flash memory, magnetic storage, opto-magnetic storage or a suitable selection or array of volatile or non-volatile memory that retains data after power is removed.

In information handling system 100, components 20 of an I/O subsystem may comprise a system, device, or apparatus generally operable to receive and transmit data to, from or within information handling system 100. Components 20 of an I/O subsystem may represent, for example, a variety of communication interfaces, graphics interfaces for communicating with a display, video interfaces, user input interfaces, and peripheral interfaces. Components 20 of an I/O subsystem may include more, fewer, or different input/output devices or components.

Components 20 of local storage resource may comprise computer-readable media (e.g., hard disk drive, floppy disk drive, CD-ROM, and other types of rotating storage media, flash memory, EEPROM, or another type of solid-state storage media) and may be generally operable to store instructions and data. For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory, such as a solid-state drive (SSD) comprising solid-state flash memory; as well as communications media such as wires, optical fibers, microwaves, radio waves, and other electromagnetic or optical carriers; or any combination of the foregoing.

Still referring to FIG. 1, components 20 of a network subsystem may be a suitable system, apparatus, or device operable to serve as an interface between information handling system 100 and a network (not shown). Components 20 of a network subsystem may enable information handling system 100 to communicate over a network using a suitable transmission protocol or standard. In some embodiments, components 20 of a network subsystem may be communicatively coupled via a network to a network storage resource (not shown). A network coupled to components 20 of a network subsystem may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to components 20 of a network subsystem may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, Advanced Technology Attachment (ATA), Serial ATA (SATA), Advanced Technology Attachment Packet Interface (ATAPI), Serial Storage Architecture (SSA), Integrated Drive Electronics (IDE), or any combination thereof. A network coupled to components 20 of a network subsystem or various components associated therewith may be implemented using hardware, software, or any combination thereof.

Balancing Cooling Requirements

During operation of information handling system 100, components generate heat in performing the processes or purposes as mentioned above and require cooling. Information handling systems, particularly portable information handling systems 100, must balance multiple cooling requirements. For example, for information handling systems that are relatively thin but operate in the range of 90-150 W of CPU and GPU power, cooling of components 20 inside a chassis may be the top priority, but the chassis must also be cooled to prevent discomfort or harm to a user.

One approach to cooling information handling systems 100 comprises a chassis having fans configured to generate airflow, and wherein a first portion of each airflow passes through a first fin stack and a second portion passes through a second fin stack. The combined surface area of two fin stacks increases the number of components that can be cooled. However, as portable information handling systems 100 get thinner, the skin temperature of a surface of the chassis (particularly a bottom cover that would most likely contact a user) becomes an issue.

Another approach is to use a hyperbaric fan to increase air pressure in a sealed chassis. As the hyperbaric fan generates airflow, air pressure is increased, causing airflow toward the center of the chassis. The hyperbaric pressure forces airflow to remove heat from inside the chassis, reducing the skin temperature of the chassis. However, for information handling systems 100 in thicker chassis, the junction temperatures of some components 20 (such as CPUs and GPUs) become an issue.

Embodiments disclosed herein may be directed to systems for cooling components in a chassis and cooling the chassis itself. Particular embodiments may be best understood by reference to FIGS. 1-3, wherein like numbers are used to indicate like and corresponding parts.

Turning now to the drawings, FIG. 1 depicts a perspective view of one embodiment of an information handling system 100 contained in a portable chassis 110 with a thermal module for cooling components of information handling system 100 in chassis 110.

Embodiments of a thermal module may be positioned in a sealed portion 111 of chassis 110, and may comprise one or more heat pipes 112 for receiving heat from one or more components 20 or cold plates 114 coupled to components 20, fin stacks 116 for receiving heat from heat pipes 112, and at least one fan 118 for generating airflow.

Heat Pipes Transfer Heat from Components to Multiple Fin Stacks

Figure 3:
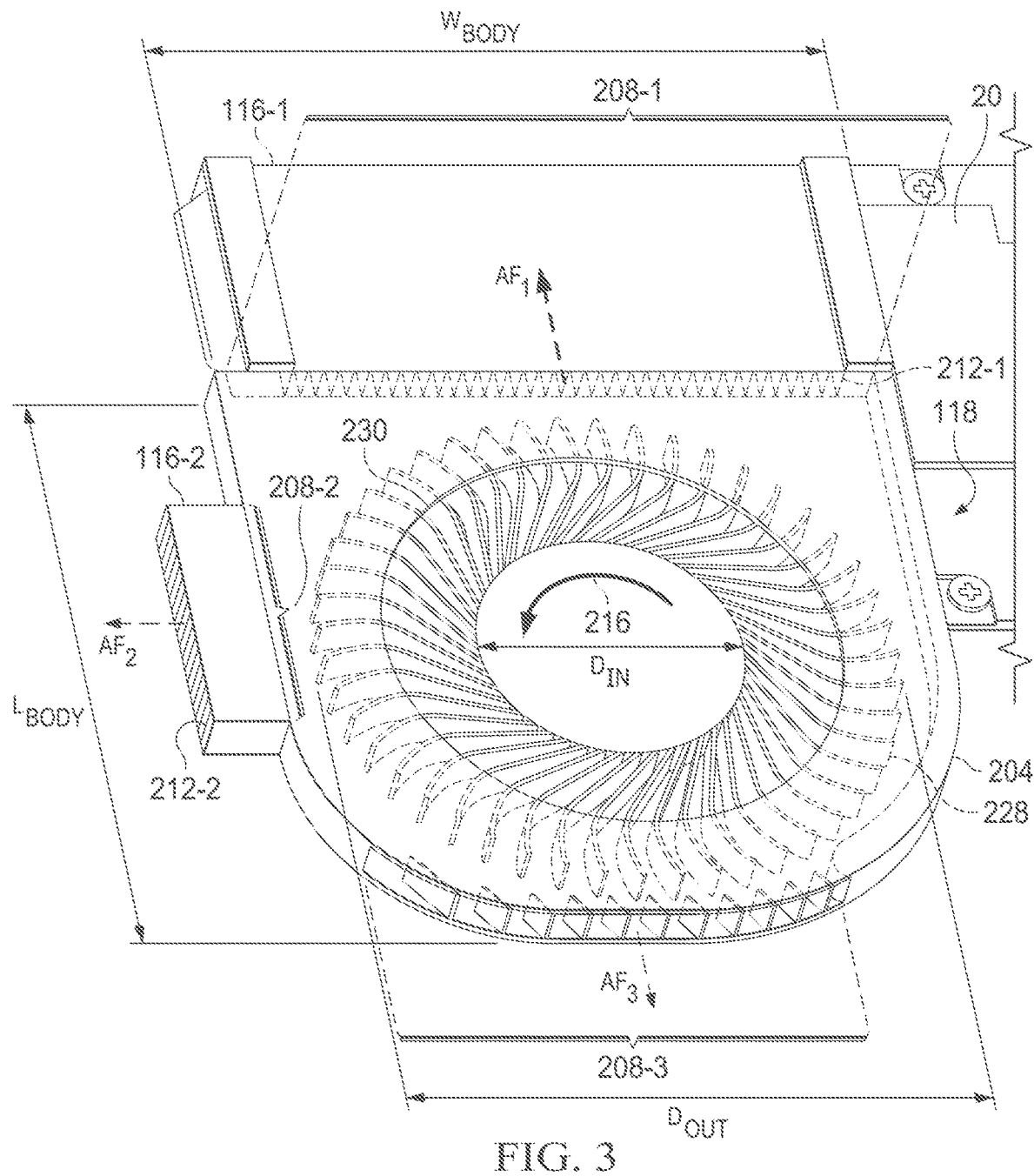
FIG. 3 depicts a cutaway view of an example thermal module for an information handling system with a hyperbaric fan for generating airflow out multiple fan outlets associated with multiple fin stacks for cooling components in a sealed chassis.

Referring to FIGS. 1 and 3, heat pipes 112 transfer heat away from cold plates 114 and components 20 of information handling system 100. Each heat pipe 112 is generally manufactured as a sealed tube containing a two-phase fluid and a wicking material. In chassis 110, a first end is positioned near a component 20 or cold plate 114 from which heat is to be removed and a second end is positioned near a fin stack 116 to which the heat is to be transferred. The process by which the heat is transferred to each fin stack 116 is through phase transformation of the fluid at the first end from a liquid to a vapor, wherein the fluid condenses at each fin stack 116 at the second end and is transported back to the first end via the wicking material.

Fin Stacks Transfer Heat from Heat Pipes to Airflow

Fin stacks 116 receive heat from heat pipes 112 and transfer the heat to an airflow directed out multiple vents 120 of chassis 110. The design and dimensions of fin stacks 116 may be selected to efficiently transfer heat, wherein the fin pitch and other parameters of fin stacks 116 may be selected to maximize heat transfer and minimize impedance. As shown in FIG. 3, a first fin stack 116-1 may be positioned between a first fan outlet 208-1 and a first vent 120-1 for transferring heat from the first portion ($AF_1$) of the generated airflow out a back cover of chassis 110 and a second fin stack 116-2 may be positioned between a second fan outlet 208-2 and a second vent 120-2 for transferring heat from the second portion ($AF_2$) of the airflow out a side cover of chassis 110. First vent 120-1 may be located on a rear cover of chassis 110 and the second vent 120-2 may be located on a side cover of chassis 110. The dimensions and parameters for each fin stack 116 may be configured for reducing airflow impedance for a particular heat transfer rate or range of heat transfer rates.

Fans Generate and Divide Airflow into Multiple Portions

Figure 2:
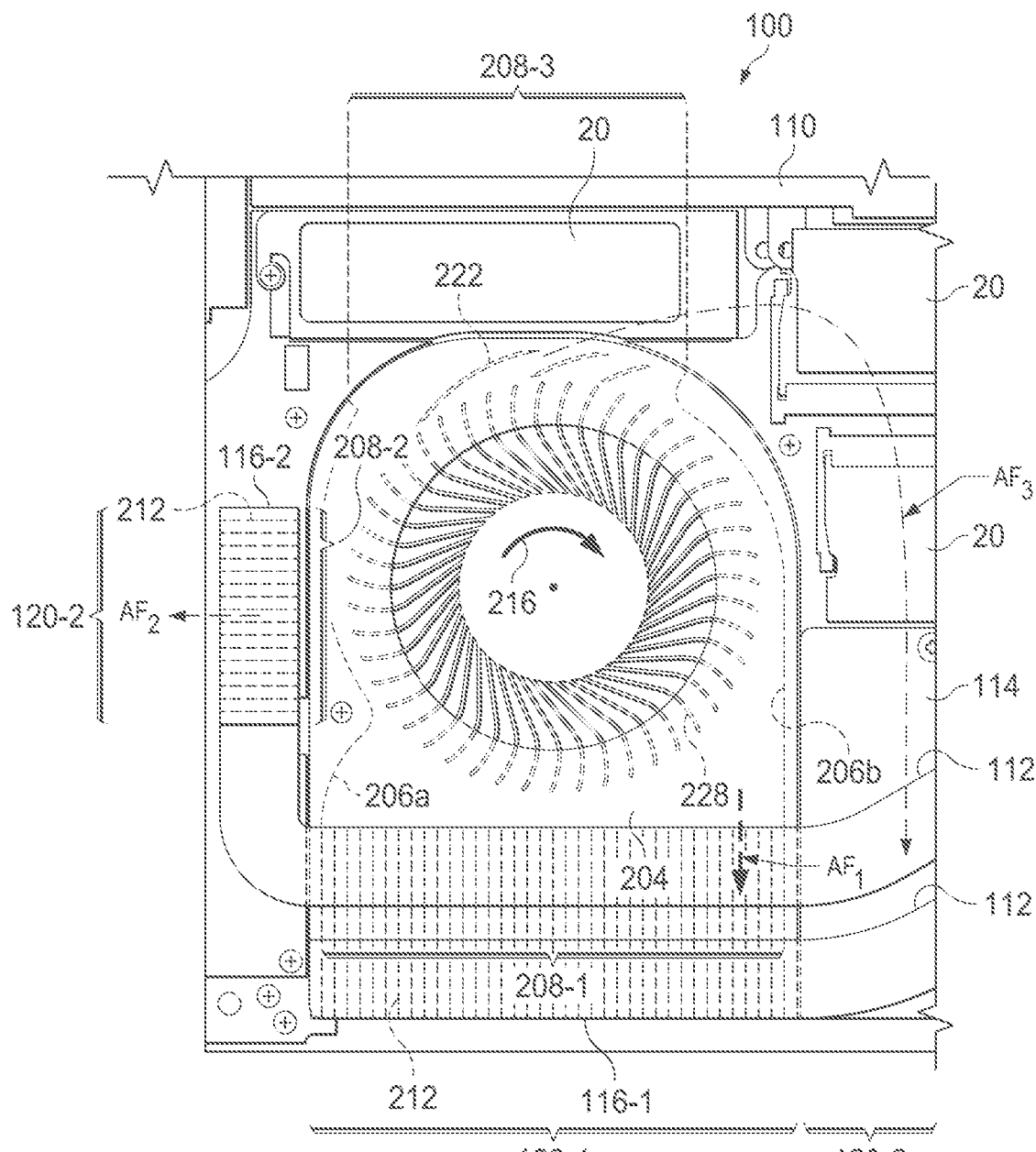
FIG. 2 depicts a cutaway perspective view of an example thermal module for an information handling system with a fan configured with three fan outlets.

A thermal module may comprise multiple fans 118 for generating airflows through chassis 110. Referring to FIG. 2, fan 118 generates an airflow with a volumetric flow rate to cool components 20 and remove heat from chassis 110. A plurality of fan blades 228 rotate in a direction 216 to draw air through intake 230 in fan housing 204, wherein intake 230 may be open to an intake vent (not shown) in a bottom cover of chassis 110. As fan blades 218 rotate, airflow is generated. For chassis 110 with two fans 118, fans 118 may rotate in opposite directions or the same direction 216. Two fans 118 rotating in opposite directions may ensure airflow flowing into chassis 110 reaches all components 20 in sealed portion 111 of chassis 110. Each fan housing 204 may comprise three fan outlets 208, wherein a first portion ($AF_1$) exits first fan outlet 208-1, a second portion ($AF_2$) exits second fan outlet 208-2 and a third portion ($AF_3$) exits third fan outlet 208-3.

First fan outlet 208-1 may be configured with a first length and a first height for directing first portion $AF_1$ to flow through first fin stack 116-1. First fin stack 116-1 may have a first plurality of fins 212-1 with a first fin pitch and a corresponding impedance.

Second fan outlet 208-2 may be configured with a second length and second height for directing second portion $AF_2$ to flow through second fin stack 116-2. Second fin stack 116-2 may have a second plurality of fins 212-2 with a second fin pitch and a corresponding impedance. Second fan outlet 208-2 may be smaller than first fan outlet 208-1.

Third fan outlet 208-3 may be configured with a third length and third height for directing third portion $AF_3$ to flow through chassis 110. Third fan outlet 208-3 may be formed opposite first fan outlet 208-1 such that first fan outlet 208-1 and third fan outlet 208-3 are opposite each other.

Multiple Portions of Airflow Through Multiple Fin Stacks are Balanced with Hyperbaric Airflow in the Chassis First fan outlet 208-1, second fan outlet 208-2 and third fan outlet 208-3 may be sized to balance portions of the airflow for increased cooling of components 20 and chassis 110 according to a ratio. The ratio of the portions of airflow exiting each outlet 208 may be based on cooling components 20 in the sealed portion 111 of chassis 110 and reducing skin temperatures of surfaces of chassis 110.

Hyperbaric Fans with Large Fan-Body Ratios

Referring to FIG. 3, fan 118 has a fan-body ratio defined by the dimensions of fan 118 relative to the dimensions of fan housing 204 (the fan "body"). A fan-body ratio may refer to the outer diameter (Dom) of the fan blades 228 relative to a width ($W_{BODY}$) or a length ($L_{BODY}$) of fan housing 204, whichever is shorter. As an example, for fan 118 with $D_{OUT}$ of 50 mm and fan housing 204 with a width ($W_{BODY}$) of 70 mm and a length ($L_{BODY}$) of 60 mm, the fan-body ratio is 50 mm/60 mm or approximately 83.3%

If the fan-body ratio is too small, this may indicate fan 118 is too small to generate an airflow capable of removing heat from chassis 110. If heat is not removed from chassis 110, a temperature of a bottom cover of chassis 110 may reach a temperature that is uncomfortable or even harmful to a user. If the fan size is too small, increasing the size of fan 118 may not address the problem. For example, if the size of chassis 110 is increased to accommodate a larger fan 118, the airflow through chassis 110 may be reduced such that a temperature of components 20 in chassis 110 reach a temperature that affects the performance of components 20 in chassis 110.

In some embodiments, in a portable, sealed chassis 110, a fan-body ratio greater than 80% may be necessary to generate an airflow capable of cooling components 20 and removing heat from chassis 110. In some embodiments, in a portable, sealed chassis 110, a fan-body ratio greater than 85% may be necessary to generate an airflow capable of cooling components 20 and removing heat from chassis 110. In some embodiments, in a portable, sealed chassis 110, a fan-body ratio greater than 90% may be necessary to generate an airflow capable of cooling components 20 and removing heat from chassis 110.

Sealed Chassis Facilitates Third Portion of Airflow Cooling Components and Chassis As mentioned above, chassis 110 may comprise sealed portion 111, which may be defined by a gasket (not shown) formed as a continuous barrier around at least a portion of chassis 110. In some embodiments, sealed portion 111 of chassis 110 may prevent air from entering chassis 110 except through intake 230 of one or more fans 118 or exiting chassis 110 except through vents 120. A sealed chassis 110 may allow third portion $AF_3$ of the airflow generated by one or more fans 118 to increase positive air pressure inside chassis 110, wherein the positive air pressure forces airflow past components 20 before exiting chassis 110 out of third vent 120-3 to transfer heat to the ambient environment.

Referring to FIG. 2, a thermal module for a sealed portion 111 of chassis 110 may include heat pipes 112 for transferring heat from components 20 to fin stacks 116. Fan 118 generates airflow, wherein a first portion $AF_1$ exits first fan outlet 208-1 and passes through fin stack 116-1 to transfer heat from components 20 through vent 120-1 to the ambient environment, a second portion $AF_2$ exits second fan outlet 208-2 and passes through fin stack 116-2 to transfer heat from components 20 through vent 120-2 to the ambient environment and third portion $AF_3$ exits third fan outlet 208-3 into sealed portion 111 of chassis to transfer heat from components 20 through vent 120-3 to the ambient environment.

In some embodiments, one or more of the fan-body ratio of fan 118, the size of fan outlets 208 and the impedance of fin stacks 116 may be configured to ensure first portion $AF_1$ and third portion $AF_3$ of an airflow are substantially equal. In some embodiments, first fan outlet 208-1 may be configured to direct first portion $AF_1$ comprising approximately 40% to flow through fin stack 116-1 and second fan outlet 208-2 may be configured to direct second portion $AF_2$ comprising approximately 20% to through fin stack 116-2. Fin stack 116-1 may be configured with a first set of fins 212-1 to provide a first heat transfer rate with a first impedance and fin stack 116-2 may be configured with a second set of fins 212-2 to provide a second heat transfer rate with a second impedance. In these embodiments, the combined impedances may cause third fan outlet 208-3 to direct third portion $AF_3$ comprising approximately 40% to flow into chassis 110. This configuration may direct more airflow inside chassis 110 for cooling a surface temperature of a cover of chassis 110.

In some embodiments, one or more of the fan-body ratio of fan 118, the size of fan outlets 208 and the impedance of fin stacks 116 may be configured to ensure first portion $AF_1$ is largest, third portion $AF_3$ is second largest and third portion $AF_2$ is smallest. In some embodiments, first fan outlet 208-1 may be configured to direct first portion $AF_1$ comprising approximately 40% to flow through fin stack 116-1 and second fan outlet 208-2 may be configured to direct second portion $AF_2$ comprising approximately 25% to through fin stack 116-2. Fin stack 116-1 may be configured with a first set of fins 212-1 to provide a first heat transfer rate with a first impedance and fin stack 116-2 may be configured with a second set of fins 212-2 to provide a second heat transfer rate with a second impedance. In these embodiments, the combined impedances may cause third fan outlet 208-3 to direct third portion $AF_3$ comprising approximately 35% to flow into chassis 110. This configuration may direct more airflow through fin stacks 116 for cooling of components 20 coupled to heat pipes 112 and less airflow for cooling a surface temperature of a cover of chassis 110.

In some embodiments, a fan-body ratio of fan 118 may be selected to ensure the impedance associated with first portion $AF_1$ and second portion $AF_2$ are substantially equal to the impedance for third portion $AF_3$. In some embodiments, first fin stack 116-1 comprises a first length and a first plurality of fins 212-1 corresponding to a first impedance, second fin stack 116-2 comprises a second length and a second plurality of fins 212-2 corresponding to a second impedance, and air pressure in chassis 110 may correspond to a third impedance. In these embodiments, the ratio of the combined first impedance and the second impedance may be substantially equal to the third impedance.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A thermal module for cooling a sealed chassis for an information handling system, the thermal module comprising:
   at least one fan comprising:
      a fan housing for a fan motor and a plurality of fan blades, the fan housing having an intake for drawing airflow into the fan and a plurality of fan outlets for directing the airflow out of the fan housing, wherein:
         a fan-body ratio defined as a ratio of a first dimension comprising a diameter of the plurality of fan blades relative to a second dimension comprising one of a width of the fan housing or a length of the fan housing is at least 80%;
         a first fan outlet is configured to direct a first portion of the airflow to a first fin stack with a first impedance toward a rear cover vent on the chassis to an ambient environment;
         a second fan outlet is configured to direct a second portion of the airflow to a second fin stack with a second impedance toward a side cover vent on the chassis to the ambient environment; and
         a third fan outlet is configured to direct a third portion of the airflow toward a plurality of components inside the chassis, wherein the first fan outlet, the first fin stack, the second fan outlet, the second fin stack and the third fan outlet are configured to distribute the first portion of the airflow, the second portion of the airflow and the third portion of the airflow according to a ratio, wherein the second portion of the airflow is less than the first portion of the airflow and the third portion of the airflow.

2. The thermal module of claim 1, wherein the first portion of the airflow has a first flow rate, the second portion of the airflow has a second flow rate portion of the airflow has a third flow rate, wherein the second flow rate is less than the first flow rate and the third flow rate.

3. The thermal module of claim 1, wherein:
   the ratio comprises the first portion of the airflow between 30-40% of the airflow and the third portion of the airflow between 30-40% of the airflow, wherein the second portion of the airflow comprises a remaining percentage of the airflow.

4. The thermal module of claim 2, wherein:
   the ratio comprises the first portion of the airflow between 35-40% and the third portion of the airflow between 25-45%, wherein the second portion of the airflow comprises a remaining percentage of the airflow.

5. The thermal module of claim 1, wherein at least a portion of the fan housing is curvilinear.

6. The thermal module of claim 5, wherein the fan-body ratio is greater than 85%.

7. A chassis for an information handling system, the chassis comprising:
   a bottom cover;
   at least two side covers;
   a top cover;
   a plurality of components located in the chassis;
   a gasket positioned in the chassis and configured to seal the chassis; and
   a thermal module comprising:
      at least one fan comprising:
         a fan housing for a fan motor and a plurality of fan blades, the fan housing having an intake open to a bottom cover of the chassis for drawing airflow into the fan and a plurality of fan outlets for directing the airflow out of the fan housing, wherein:
            a fan-body ratio defined as a ratio of a first dimension comprising a diameter of the plurality of fan blades relative to a second dimension comprising one of a width of the fan housing or a length of the fan housing is at least 80%;
            a first fan outlet is configured to direct a first portion of an airflow to a first fin stack with a first impedance toward a back cover vent on the chassis to an ambient environment;
            a second fan outlet is configured to direct a second portion of the airflow to the second fin stack with a second impedance toward a a side cover vent on the chassis to the ambient environment; and a third fan outlet is configured to direct a third portion of the airflow toward a plurality of components inside the chassis, wherein the first fan outlet, the first fin stack, the second fan outlet, the second fin stack and the third fan outlet are configured to distribute the first portion of the airflow, the second portion of the airflow and the third portion of the airflow according to a ratio, wherein the second portion of the airflow is less than the first portion of the airflow and the third portion of the airflow.

8. The chassis of claim 7, wherein the first portion of the airflow has a first flow rate, the second portion of the airflow has a second flow rate and the third portion of the airflow has a third flow rate, wherein the second flow rate is less than the first flow rate and the third flow rate.

9. The chassis of claim 7, wherein:
the ratio comprises the first portion of the airflow between 30-40% of the airflow and the third portion of the airflow between 30-40% of the airflow, wherein the second portion of the airflow comprises a remaining percentage of the airflow.

10. The chassis of claim 7, wherein:
the ratio comprises the first portion of the airflow between 35-40% and the third portion of the airflow between 25-45%, wherein the second portion of the airflow comprises a remaining percentage of the airflow.

11. The chassis of claim 7, wherein at least a portion of the fan housing is curvilinear.

12. The chassis of claim 7, wherein the fan-body ratio is greater than 85%.

13. An information handling system, comprising:
a chassis comprising a bottom cover, at least two side covers and a top cover;
a plurality of components located in the chassis;
a gasket positioned in the chassis and configured to seal the chassis; and
a thermal module comprising:
at least one fan comprising:
a fan housing for a fan motor and a plurality of fan blades, the fan housing having an intake open to a bottom cover of the chassis for drawing an airflow into the fan and a plurality of fan outlets for directing the airflow out of the fan housing, wherein:
a fan-body ratio defined as a ratio of a first dimension comprising a diameter of the plurality of fan blades relative to a second dimension comprising one of a width of the fan housing or a length of the fan housing is at least 80%;
a first fan outlet is configured to direct a first portion of the airflow through a first fin stack with a first impedance toward a back cover vent on the chassis to an ambient environment;
a second fan outlet is configured to direct a second portion of the airflow through a second fin stack with a second impedance toward a side cover vent on the chassis to the ambient environment; and
a third fan outlet is configured to direct a third portion of the airflow toward a plurality of components inside the chassis wherein the first fan outlet, the first fin stack, the second fan outlet, the second fin stack and the third fan outlet are configured to distribute the first portion of the airflow, the second portion of the airflow and the third portion of the airflow according to a ratio, wherein the second portion of the airflow is less than the first portion of the airflow and the third portion of the airflow.

14. The information handling system of claim 13, wherein the first portion of the airflow has a first flow rate, the first fin stack, the second portion of the airflow has a second flow rate and the third portion of the airflow has a third flow rate, wherein the second flow rate is less than the first flow rate and the third flow rate.

15. The information handling system of claim 14, wherein:
the ratio comprises the first portion of the airflow between 30-40% of the airflow and the third portion of the airflow between 30-40% of the airflow, wherein the second portion of the airflow comprises a remaining percentage of the airflow.

16. The information handling system of claim 14, wherein:
the ratio comprises the first portion of the airflow between 35-40% and the third portion of the airflow between 25-45%, wherein the second portion of the airflow comprises a remaining percentage of the airflow.

17. The information handling system of claim 13, wherein at least a portion of the fan housing is curvilinear.

18. The information handling system of claim 13, wherein the fan-body ratio is greater than 85%.

19. The information handling system of claim 13, wherein a first fan is configured to rotate in a first direction and a second fan is configured to rotate in a second direction opposite the first direction.

* * * * *